United States Patent [19]
Choi et al.

[11] Patent Number: 6,151,250
[45] Date of Patent: Nov. 21, 2000

[54] FLASH MEMORY DEVICE AND VERIFY METHOD THEREOF

[75] Inventors: Ki-Hwan Choi, Seoul; Jong-Min Park, Suwon, both of Rep. of Korea

[73] Assignee: Samsung Electronics, Co., Ltd., Suwon, Rep. of Korea

[21] Appl. No.: 09/430,444

[22] Filed: Oct. 29, 1999

[30] Foreign Application Priority Data

Oct. 30, 1998 [KR] Rep. of Korea ........................ 98-46482

[51] Int. Cl.$^7$ .................................................. G11C 16/06
[52] U.S. Cl. .............................. 365/185.22; 365/189.11; 365/196
[58] Field of Search ........................ 365/185.22, 185.01, 365/207, 231, 196, 189.09, 189.11

[56] References Cited

U.S. PATENT DOCUMENTS

| | | | |
|---|---|---|---|
| 4,829,482 | 5/1989 | Owen | 365/189.09 |
| 5,351,217 | 9/1994 | Jeon | 365/230.06 |
| 5,355,347 | 10/1994 | Cioaca | 365/230.08 |
| 5,768,190 | 6/1998 | Tanaka et al. | 365/185.22 |

*Primary Examiner*—David Nelms
*Assistant Examiner*—Thong Le
*Attorney, Agent, or Firm*—Marger Johnson & McCollom, P.C.

[57] ABSTRACT

A word line voltage supply circuit for a nonvolatile semiconductor memory device reduces power supply noise by deactivating a high voltage generator during a verify sensing operation. The word line voltage supply circuit includes a high voltage generator that produces a high voltage signal in response to a control signal from a controller. A voltage regulator regulates the high voltage signal to generate a verify voltage signal that is applied to a selected memory cell. The controller deactivates the control signal during a verify sensing operation so as to eliminate power supply noise caused by the pumping operation of the high voltage generator.

11 Claims, 6 Drawing Sheets

FLASH MEMORY DEVICE AND VERIFY METHOD THEREOF

This application claims priority from Korean patent application No. 98-46482 filed Oct. 30, 1998 in the name of Samsung Electronics Co., Ltd., which is herein incorporated by reference.

BACKGROUND OF THE INVENTION

1. Field of the Invention

The present invention relates to nonvolatile semiconductor memory devices, and more particularly to a NOR-type flash memory device and a verify method thereof.

2. Description of the Related Art

FIG. 1 is a block diagram of a conventional NOR-type flash memory device. FIG. 2 is a circuit diagram showing more details of the word line voltage supplying circuit of FIG. 1 along with a row selector and a word line voltage supplying circuit associated with a memory cell.

Referring to FIG. 1, the flash memory device includes a memory cell array 10 which, although not shown, has a plurality of word lines, a plurality of bit lines and a plurality of memory cells arranged at intersections of the word lines and the bit lines. Each of the memory cells has a control gate connected to a corresponding word line, a floating gate, a source grounded, and a drain connected to a corresponding bit line, as illustrated in FIG. 2. FIG. 3 is a sectional diagram of the memory cell shown in FIG. 2.

Referring again to FIG. 1, at the left side of the array 10 is a row selector 20 which selects the word lines in accordance with a row address from the address buffer 30. As illustrated in FIG. 2, the row selector 20 includes one NAND gate G1 which receives decoded row address signals DRAi, one invertor INV1 and one level shifter LS1 connected as illustrated in FIG. 2. The row selector 20 selects one of the word lines in response to the decoded row address signals DRAi, and then drives the selected word line with a word line voltage signal from a word line voltage supplying circuit 50.

The word line voltage supplying circuit 50 includes a high voltage generator 52, a voltage regulator 54, and a switching circuit 56. The high voltage generator 52 produces a high voltage signal VPI (for example, 10V) in response to a verify enable signal VE_EN during a verify operation. The high voltage generator 52 can be realized by use of a charge pumping circuit as is well known in the art. The voltage regulator 54 controls the level of the high voltage signal VPI to provide a voltage signal VPP which is required for various verify modes of operation. The voltage regulator 54 can be realized using resistive or capacitive dividing techniques which are well known.

The switching circuit 56 includes two level shifters LS2 and LS3, and two PMOS transistors MP1 and MP2 connected as illustrated in FIG. 2. The switching circuit 56 transfers either the power supply voltage VCC or the voltage VPP from the voltage regulator 54 to the row selector 20 in response to the verify enable signal VE_EN. For instance, when the signal VE_EN is at a logic low level, the PMOS transistor MP1 is turned off and the PMOS transistor MP2 is turned on, so that the power supply voltage VCC is transferred to the row selector 20 as a word line voltage. When the signal VE_EN is at a logic high level, the PMOS transistor MP1 is turned on and the PMOS transistor MP2 is turned off, so that the voltage VPP is transferred to the row selector 20 as the word line voltage.

Referring again to FIG. 1, the flash memory device further includes a sense amplifier circuit 60, an input/output buffer circuit 70 and a control logic and command register 80. The address buffer circuit 30, the column selector 40, the sense amplifier circuit 60 and the input/output buffer circuit 70 are controlled by the control logic and command register 80. Each of the memory cells is programmed by applying a high voltage of, for example, 10V to the control gate, a low voltage such as the ground voltage to the source and the bulk, and a voltage of, for example, 5V to 6V to the drain. The programmed memory cells are referred to as "OFF cells", and have a threshold voltage distribution of 6V through 7V, respectively. The memory cells of the array 10 are simultaneously erased by applying a negative high voltage of, for example, -10V, to the control gates and a voltage of, for example, 5V, to the bulk and by allowing the drains and the sources to float. The erased memory cells are referred to as "ON cells", and have a threshold voltage distribution of 1V through 3V, respectively. Threshold voltages distribution associated with OFF cells and ON cells are shown in FIG. 4.

In order to determine whether the memory cells are programmed or erased, a verify operation is normally performed after the erase and program operation. The verify operation is divided into an overerase verify operation, an erase verify operation, and a program verify operation. The verify operation is identical to a read operation except that the word line voltage used for the read operation is different from that used for the verify operation. For example, a voltage of about 2.8V is applied to a selected word line during an overerase verify operation, a voltage of about 3.5V is applied to the selected word line during an erase verify operation, and a voltage about 6.5V is applied to the selected word line during a program verify operation.

FIG. 5 is a timing diagram for illustrating a verify operation in a conventional flash memory device. Referring to FIG. 5, the verify operation is initiated as the signal VE_EN transitions from a logic low level to a logic high level. In particular, the high voltage generator 52 produces the high voltage VPI in response to the low-to-high transition of the signal VE_EN. At this time, the PMOS transistor MP1 of the switching circuit 56 is turned on, and the PMOS transistor MP2 is turned off. As the high voltage VPI increases, the voltage VPP regulated by the voltage regulator 54 (hereinafter, referred to as the verify voltage) is transferred via the row selector 20 to the word line WL connected to a selected memory cell. Then, when a sense enable signal SA_EN is activated, the sense amplifier 40 detects the threshold voltage of the selected memory cell using a reference voltage from a reference cell to determine whether the selected memory cell is programmed (erased, or overerased) in accordance with the detected result.

As described above, the verify voltages 2.8V, 3.5V and 6.5V for the respective verify operations are derived from the high voltage VPI which is generated by the high voltage generator 52. However, when the high voltage generator 52 produces the high voltage VPI, power supply noise (for example, 10 mV through 50 mV) inevitably arises on the power/ground lines as illustrated in FIG. 5. This causes malfunctions during verify sensing operations in which a fine voltage difference (for example, -30 mV) is detected between a data line DL connected to the memory cell and a reference data line RDL connected to the reference cell. As a result, the threshold voltage of the memory cell deviates from the target threshold voltage distribution, thereby affecting read/program/erase operations which are performed after the above described verify operation.

SUMMARY OF THE INVENTION

It is therefore an object of the present invention to perform a stable verify sensing operation in a nonvolatile semiconductor memory device. The present invention reduces power supply noise in a nonvolatile semiconductor memory device by deactivating a high voltage generator during a verify sensing operation.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION

Figure 1:
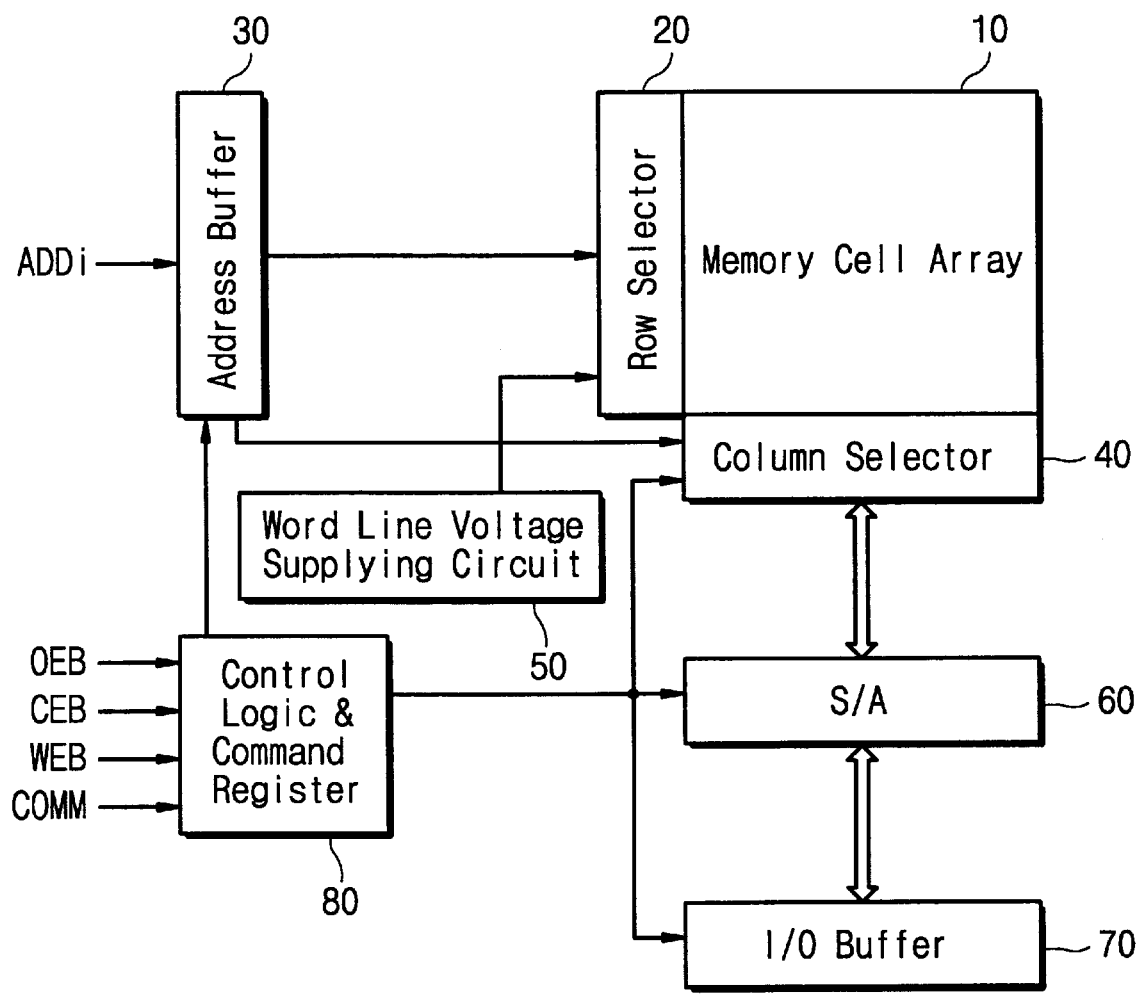
FIG. 1 is a block diagram of a conventional NOR-type flash memory device.
Figure 2:
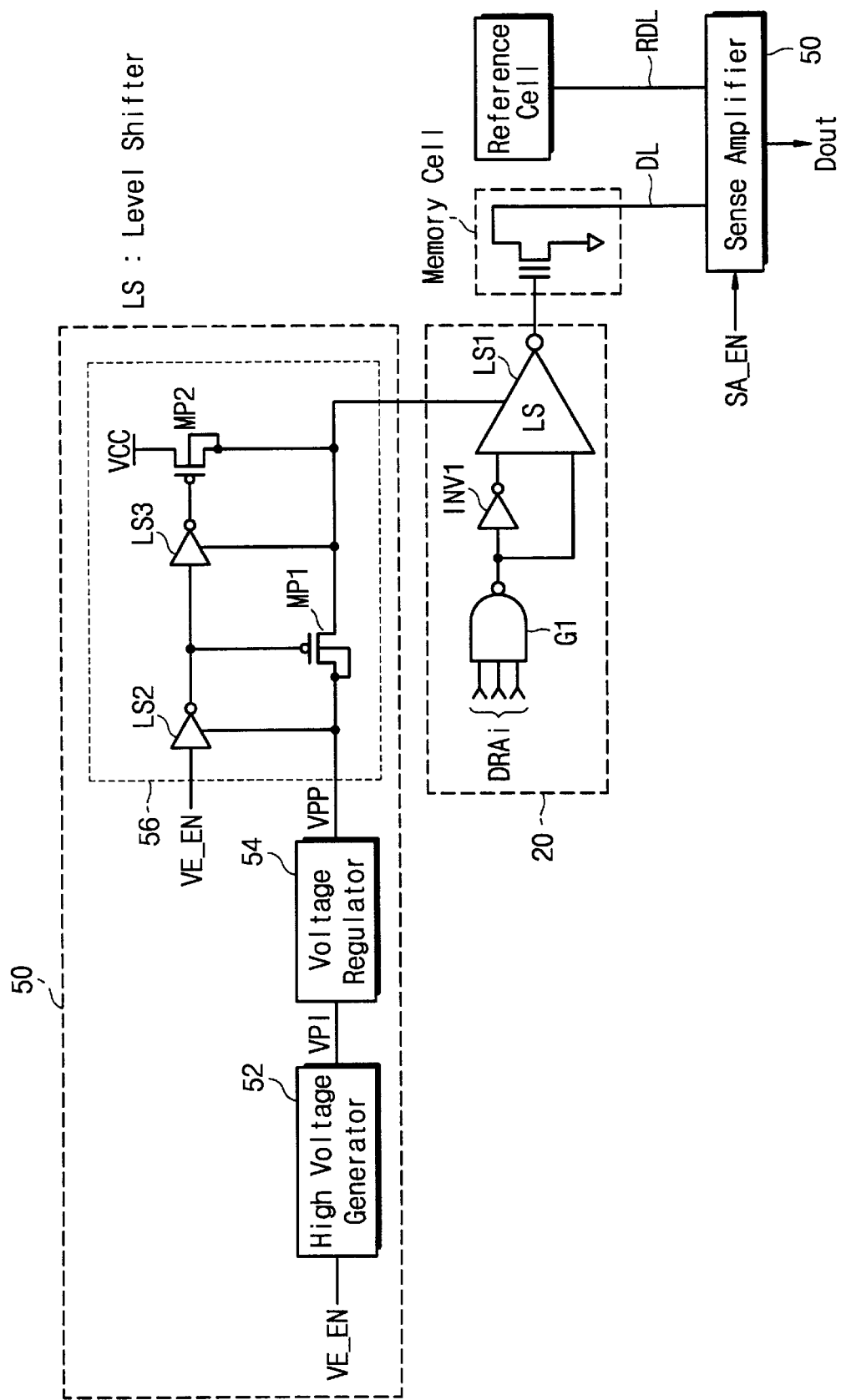
FIG. 2 is a circuit diagram showing more details of the word line voltage supplying circuit of FIG. 1 along with a row selector and a word line voltage supplying circuit associated with a memory cell.
Figure 3:
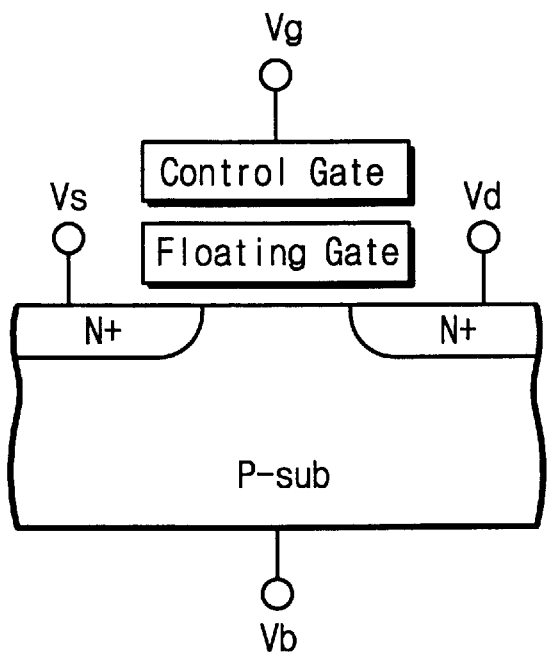
FIG. 3 is a sectional diagram of the memory cell shown in FIG. 2.
Figure 4:
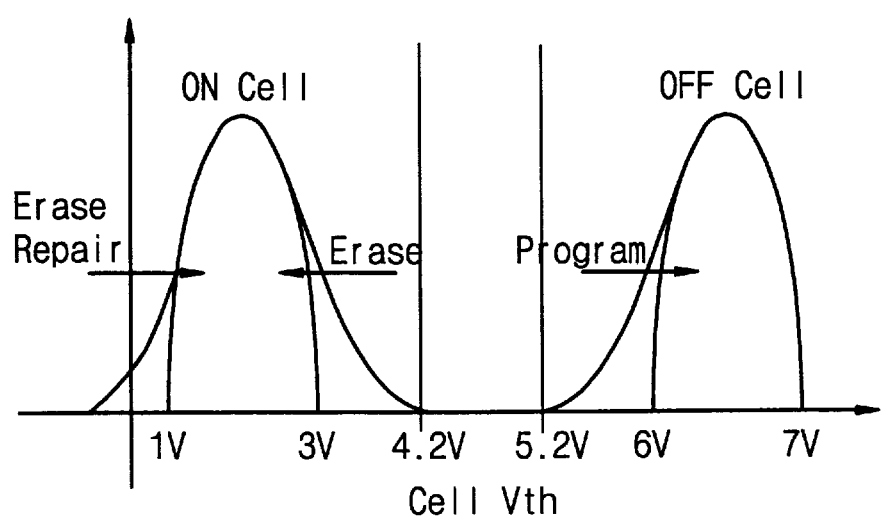
FIG. 4 is a diagram showing the threshold voltage distribution of an OFF cell and an ON cell.
Figure 5:
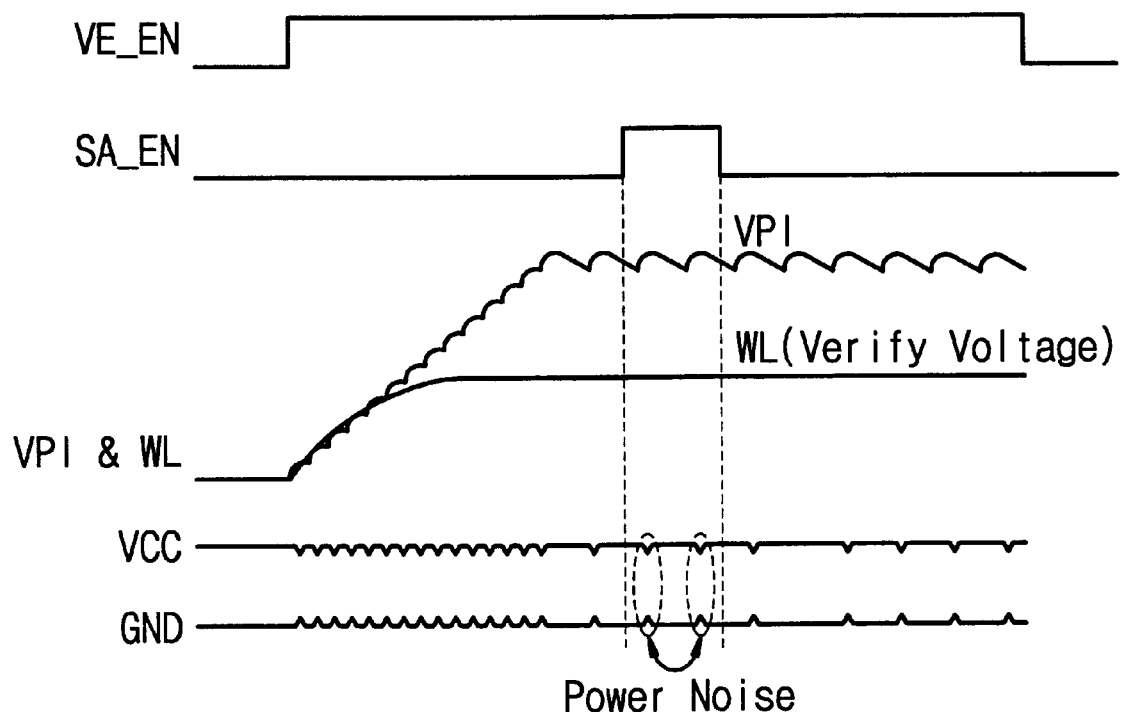
FIG. 5 is a timing diagram for illustrating a verify operation in a conventional flash memory device.
Figure 6:
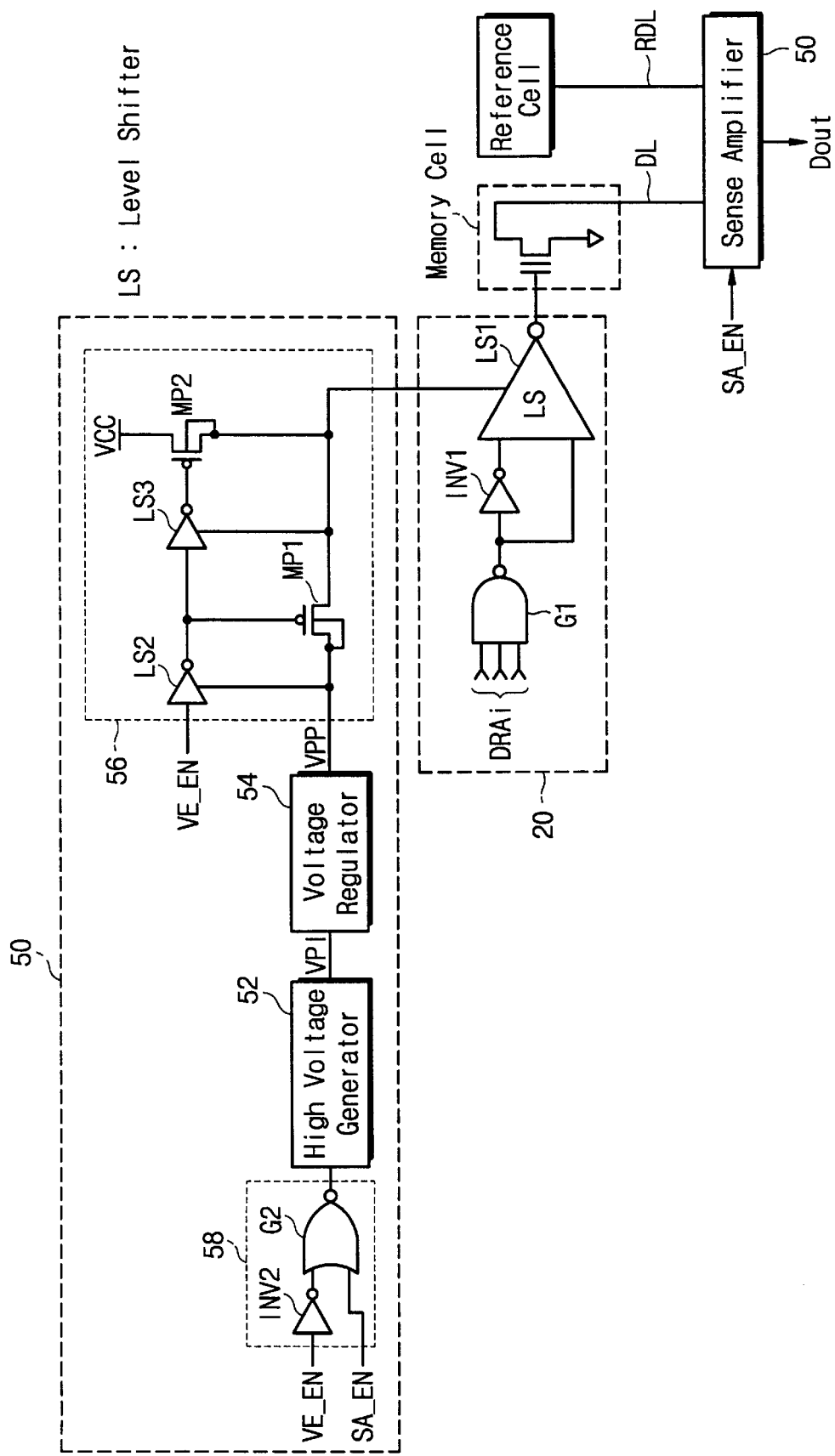
FIG. 6 is block diagram of a preferred embodiment of a word line voltage supplying circuit according to the present invention.

FIG. 6 is a diagram showing a flash memory device according to the present invention. In FIG. 6, a row selector, a word line voltage supplying circuit, and a sense amplifier circuit associated with a memory cell are illustrated, but other component shown in FIG. 1 are also provided in the flash memory device of the present invention. In FIG. 6, component elements that are identical to those of FIG. 1 are labeled with the same reference numerals.

The word line voltage supplying circuit 50 of the present invention differs from that of the conventional flash memory device in that a controller 58 is added which controls the activation and deactivation of the high voltage generator 52 in response to the signals VE_EN and SA_EN. The controller 58 includes one NOR gate G2 and one invertor INV2 connected as illustrated in FIG. 6. The signal SA_EN indicates a sensing operation and the signal VE_EN indicates a verify operation. According to the circuit structure of the present invention, the high voltage generator 52 is deactivated when the signal SA_EN is activated during the activation of the signal VE_EN. The high voltage generator 52 is activated when the signal SA_EN is deactivated during the activation of the signal VE_EN. Therefore, no power supply noise arises during the verify sensing operation, and malfunctions are prevented.

Figure 7:
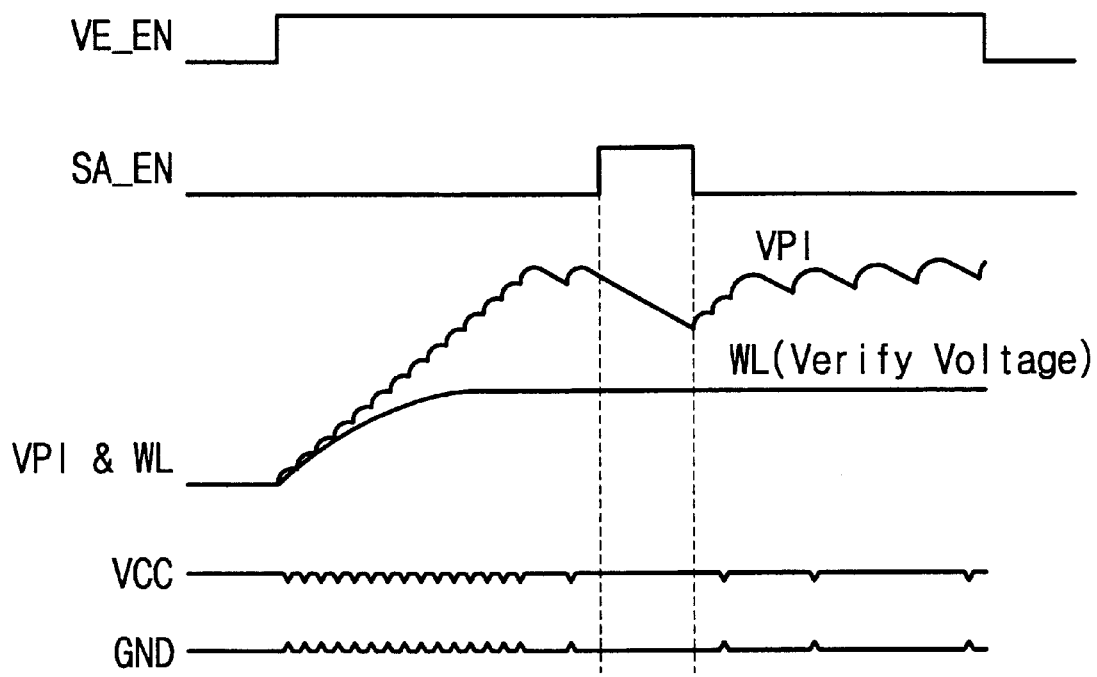
FIG. 7 is a timing diagram for illustrating a verify operation in a flash memory device according to the present invention.

A verify operation in accordance with the present invention will be more fully described below with reference to FIG. 7. Referring to FIG. 7, the verify operation starts when the signal VE_EN transitions from a logic low level to a logic high level. When the signal VE_EN goes high, the switching circuit 56 connects the voltage regulator 54 to the row selector 20 so as so transfer the verify voltage signal VPP onto a selected word line WL. In particular, the PMOS transistor MP1 of the switching circuit 56 is turned on and the PMOS transistor MP2 thereof is turned off.

The controller 58 activates the high voltage generator 52 when the signal VE_EN is at a logic high level and the signal SA_EN is at a logic low level. As the high voltage generator 52 is activated, the voltage level of the high voltage signal VPI increase as shown in FIG. 7. When the high voltage VPI reaches the voltage required for the respective verify operations, the high voltage signal VPI is clamped at a verify voltage level VPP by the voltage regulator 54. The verify voltage VPP thus clamped is transferred to the selected word line WL via the PMOS transistor MP1 and the row selector 20.

As illustrated in FIG. 7, while the signal SA_EN is activated, the sense amplifier circuit 60 detects the threshold voltage of the selected memory cell using a reference voltage from a reference cell. Unlike the conventional flash memory device, the high voltage generator 52 is deactivated by the controller 58 during the verify sensing operation. That is, since the signal SA_EN goes high, the output of the controller 58 transitions from a logic high level to a logic low level so as to deactivate the high voltage generator 52. Thus, the high voltage generator 52 does not performe pumping operations during the activation of the signal SA_EN. As a result, no power supply noise is created during the verify sensing operation as illustrated in FIG. 7. When the signal SA_EN is deactivated again, the high voltage generator 52 performs the pumping operation so that the high voltage signal VPI increases to its target level. The verify operation is then ended by deactivating the signal VE_EN.

As above described, during the verify sensing operation, the high voltage generator 52 is deactivated so that no power supply noise due to the pumping operation of the generator 52 arises. Accordingly, a stable verify sensing operation can be achieved, thereby preventing the problems inherent in the conventional flash memory device, e.g., malfunctioning of the verify sensing operation and threshold voltage deviation.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A nonvolatile semiconductor memory device comprising:

a memory cell array having a plurality of memory cells arranged in rows and columns;

a high voltage generator for generating a high voltage signal in response to a control signal;

a voltage regulator coupled to the high voltage generator for regulating the high voltage signal to produce a verify voltage signal which is applied to a selected row; and a controller coupled to the high voltage generator for generating the control signal, wherein the controller deactivates the control signal responsive to a sense enable signal during a verify sensing operation, thereby deactivating the high voltage generator.

2. The nonvolatile semiconductor memory device according to claim 1, further comprising:

a row selector coupled to the memory cell array for selecting one of the rows; and a switching circuit coupled between the row selector and the voltage regulator for transferring the verify voltage signal to the row selector in response to a verify enable signal.

3. The nonvolatile semiconductor memory device according to claim 2, wherein each of the memory cells comprises a transistor having a floating gate.

4. A nonvolatile semiconductor memory device comprising:

a memory cell array having a plurality of memory cells arranged in rows and columns;

a high voltage generator for generating a high voltage signal in response to a control signal;

a voltage regulator coupled to the high voltage generator for regulating the high voltage signal to produce a verify voltage signal which is applied to a selected row; and a controller coupled to the high voltage generator for generating the control signal, wherein the controller deactivates the control signal during a verify sensing operation, thereby deactivating the high voltage generator;

wherein the controller comprises:
an invertor having an input terminal for receiving a verify enable signal; and
a NOR gate having one input terminal connected to an output terminal of the invertor and another input terminal for receiving a sense enable signal.

5. A nonvolatile semiconductor memory device comprising:
a memory cell array having a plurality of word lines, a plurality of bit lines and a plurality of memory cells arranged at intersections of the word lines and the bit lines;
a row selector coupled to the memory cell array for selecting one of the word lines in response to a row address;
a column selector coupled to the memory cell array for selecting one of the bit lines in response to a column address;
a sense amplifier coupled to the column selector for sensing data in a memory cell accessed by the selected word line and bit line in response to a sense enable signal; and
a word line voltage supply circuit coupled to the row selector for generating a verify voltage signal, wherein the word line voltage supply circuit includes a high voltage generator, and wherein the word line voltage supply circuit disables the high voltage generator during a verify sensing operation; and
wherein the word line voltage supply circuit further includes:
a voltage regulator coupled to the high voltage generator for generating a verify voltage signal responsive to the high voltage signal;
a switching circuit coupled between the voltage regulator and the row selector for transferring the verify voltage signal to the row selector; and
a controller coupled to the high voltage generator for deactivating the high voltage generator responsive to a sense enable signal.

6. The nonvolatile semiconductor memory device according to claim 5, wherein each of the memory cells comprises a transistor having a floating gate.

7. A nonvolatile semiconductor memory device comprising:
a memory cell array having a plurality of word lines, a plurality of bit lines and a plurality of memory cells arranged at intersections of the word lines and the bit lines;
a row selector coupled to the memory cell array for selecting one of the word lines in response to a row address;
a column selector coupled to the memory cell array for selecting one of the bit lines in response to a column address;
a sense amplifier coupled to the column selector for sensing data in a memory cell accessed by the selected word line and bit line in response to a sense enable signal; and a word line voltage supply circuit coupled to the row selector for generating a verify voltage signal, wherein the word line voltage supply circuit includes a high voltage generator, and wherein the word line voltage supply circuit disables the high voltage generator during a verify sensing operation;
wherein the word line voltage supply circuit further includes:
a voltage regulator coupled to the high voltage generator for generating a verify voltage signal responsive to the high voltage signal;
a switching circuit coupled between the voltage regulator and the row selector for transferring the verify voltage signal to the row selector; and
a controller coupled to the high voltage generator for deactivating the high voltage generator responsive to a sense enable signal; and
wherein the controller comprises:
an invertor having an input terminal of receiving a verify enable signal; and
a NOR gate having one input terminal connected to an output terminal of the invertor and another input terminal for receiving the sense enable signal.

8. A method for performing a verify operation in a nonvolatile memory device having an array of memory cells for storing data and a high voltage generator for generating a high voltage signal, the method comprising:
activating the high voltage generator in response to a verify enable signal;
regulating the high voltage signal to generate a verify voltage signal; and
deactivating the high voltage generator responsive to a sense enable signal during a verify sensing operation.

9. The method of claim 8 further comprising activating the high voltage generator after the verify sensing operation is complete.

10. A nonvolatile semiconductor memory device comprising:
a memory cell array having a plurality of memory cells arranged in rows and columns;
means for generating a high voltage signal;
means for regulating the high voltage signal to produce a verify voltage signal which is applied to a selected row; and
means for deactivating the means for generating a high voltage signal during a verify sensing operation.

11. A nonvolatile semiconductor memory device comprising:
a memory cell array having a plurality of memory cells arranged in rows and columns;
means for generating a high voltage signal;
means for regulating the high voltage signal to produce a verify voltage signal which is applied to a selected row; and
means for deactivating the means for generating a high voltage signal during a verify sensing operation;
wherein the means for deactivating the means for generating a high voltage signal includes:
an invertor having an input terminal for receiving a verify enable signal; and
a NOR gate having one input terminal connected to an output terminal of the invertor and another input terminal for receiving a sense enable signal.

* * * * *